US008892450B2

(12) United States Patent
Schildbach et al.

(10) Patent No.: US 8,892,450 B2
(45) Date of Patent: Nov. 18, 2014

(54) SIGNAL CLIPPING PROTECTION USING PRE-EXISTING AUDIO GAIN METADATA

(75) Inventors: Wolfgang A. Schildbach, Nuremberg (DE); Alexander Groeschel, Nuremberg (DE)

(73) Assignee: Dolby International AB, Amsterdam (NL)

(*) Notice: Subject to any disclaimer, the term of this patent is extended or adjusted under 35 U.S.C. 154(b) by 845 days.

(21) Appl. No.: 13/125,846

(22) PCT Filed: Oct. 26, 2009

(86) PCT No.: PCT/US2009/062004
§ 371 (c)(1),
(2), (4) Date: Apr. 25, 2011

(87) PCT Pub. No.: WO2010/053728
PCT Pub. Date: May 14, 2010

(65) Prior Publication Data

US 2011/0208528 A1 Aug. 25, 2011

Related U.S. Application Data

(60) Provisional application No. 61/109,433, filed on Oct. 29, 2008.

(51) Int. Cl.

| | |
|---|---|
| ***G10L 21/00*** | (2013.01) |
| ***G10L 19/16*** | (2013.01) |
| ***G10L 19/008*** | (2013.01) |
| *G06F 17/00* | (2006.01) |
| *H04M 9/08* | (2006.01) |
| *H04R 5/00* | (2006.01) |
| *H03G 3/00* | (2006.01) |
| *H03G 7/00* | (2006.01) |
| *H03G 5/00* | (2006.01) |

(52) U.S. Cl.
CPC ............. *G10L 19/173* (2013.01); *G10L 19/008* (2013.01)
USPC ........... 704/500; 704/210; 704/503; 704/225; 381/17; 381/27; 381/107; 381/106; 381/98; 700/94; 379/406.01

(58) Field of Classification Search
USPC ............ 704/500, 210, 225, 503; 381/17, 107, 381/106, 98, 27; 379/406.01; 700/94
See application file for complete search history.

(56) References Cited

U.S. PATENT DOCUMENTS 5,821,889 A * 10/1998 Miller ........................... 341/139

(Continued)

FOREIGN PATENT DOCUMENTS

JP 2002-151975 5/2002
JP 4726898 2/2008

(Continued)

OTHER PUBLICATIONS

Schildbach, W., et al., "Transcoding of dynamic range control coefficients and other Metadata into MPEG-4 HE AAC" 123rd Convention of AES, New York, NY, Paper 7217, Oct. 5-8, 2007, pp. 1-8.

*Primary Examiner* — Paras D Shah
*Assistant Examiner* — Neeraj Sharma

(57) ABSTRACT

The application describes a method and an apparatus to prevent clipping of an audio signal when protection against signal clipping by received audio metadata is not guaranteed. The method may be used to prevent clipping for the case of downmixing a multichannel signal to a stereo audio signal. According to the method, it is determined whether first gain values (4) based on received audio metadata are sufficient for protection against clipping of the audio signal. The audio metadata is embedded in a first audio stream (1). In case a first gain value (4) is not sufficient for protection, the respective first gain value (4) is replaced with a gain value sufficient for protection against clipping of the audio signal. Preferably, in case no metadata related to dynamic range control is present in the first audio stream (1), the method may add gain values sufficient for protection against signal clipping.

18 Claims, 4 Drawing Sheets

(56) References Cited

U.S. PATENT DOCUMENTS

| | | | | |
|---|---|---|---|---|
| 6,704,704 | B1 * | 3/2004 | Newson et al. | 704/225 |
| 7,305,346 | B2 * | 12/2007 | Oyama et al. | 704/503 |
| 7,464,029 | B2 * | 12/2008 | Visser et al. | 704/210 |
| 7,760,886 | B2 * | 7/2010 | Hellmuth et al. | 381/27 |
| 8,094,809 | B2 * | 1/2012 | Whikehart et al. | 379/406.01 |
| 8,116,485 | B2 * | 2/2012 | Escott et al. | 381/107 |
| 8,208,659 | B2 * | 6/2012 | Chalil | 381/106 |
| 8,290,181 | B2 * | 10/2012 | Stokes et al. | 381/107 |
| 8,488,811 | B2 * | 7/2013 | Smithers et al. | 381/107 |
| 8,756,066 | B2 * | 6/2014 | Kim et al. | 704/500 |
| 2002/0172376 | A1 * | 11/2002 | Bizjak | 381/94.3 |
| 2004/0138769 | A1 * | 7/2004 | Akiho | 700/94 |
| 2005/0105442 | A1 | 5/2005 | Melchior | |
| 2005/0120870 | A1 * | 6/2005 | Ludwig | 84/661 |
| 2005/0147262 | A1 * | 7/2005 | Breebaart | 381/106 |
| 2005/0157883 | A1 * | 7/2005 | Herre et al. | 381/17 |
| 2005/0228648 | A1 | 10/2005 | Heikkinen | |
| 2010/0083344 | A1 | 4/2010 | Schildbach | |
| 2011/0013783 | A1 * | 1/2011 | Sugawara | 381/98 |

FOREIGN PATENT DOCUMENTS

| | | |
|---|---|---|
| RU | 2214048 | 10/2003 |
| RU | 2323551 | 4/2008 |
| RU | 2325046 | 5/2008 |
| WO | 2006084916 | 8/2006 |
| WO | 2008100098 | 8/2008 |

* cited by examiner

SIGNAL CLIPPING PROTECTION USING PRE-EXISTING AUDIO GAIN METADATA

CROSS-REFERENCE TO RELATED APPLICATIONS

This application claims priority to U.S. Patent Provisional Application No. 61/109,433, filed 29 Oct. 2008, hereby incorporated by reference in its entirety.

FIELD OF THE INVENTION

The patent application relates to clipping protection of an audio signal using pre-existing audio metadata embedded in a digital audio steam. In particular, the application relates to clipping protection when downmixing a multichannel audio signal to fewer channels.

BACKGROUND OF THE INVENTION

It is a common concept to embed audio metadata into a digital audio stream, e.g. in digital broadcast environments. Such metadata is "data about data", i.e. data about the digital audio in the stream. The metadata can provide information to an audio decoder about how to reproduce the audio. One type of metadata is dynamic range control information which represents a time-varying gain envelope. Such dynamic range control metadata can serve multiple purposes:

(1) Control the dynamic range of reproduced audio: Digital transmission allows for a high dynamic range, but listening conditions do not always permit taking advantage of that. Although high dynamic range is desirable in quiet living room conditions, it may not be appropriate for other conditions e.g. for a car radio because of the high background noise level. To accommodate a wide variety of listening conditions, metadata instructing a receiver how to reduce the dynamic range of the reproduced audio can be inserted in the digital audio stream instead of reducing the dynamic range of the audio prior to transmission. The latter approach is not preferable as it makes it impossible for a receiver to reproduce the audio with full dynamic range. Instead, the former approach is preferred as it allows the listener to decide if dynamic range control shall be applied or not depending on the listening environment. Such dynamic range control metadata makes high-quality artistic dynamic range compression of a decoded signal available to listeners at their discretion.

(2) Prevent clipping in case of a downmix operation: When a multichannel signal (e.g. a 5.1-channel audio signal) is downmixed, the number of channels is reduced, typically to two channels. In case of reproducing a multichannel audio signal comprising more than two channels (e.g. a 5.1-channel audio signal having 5 main channels and 1 low frequency effect channel) via stereo speakers, typically a receiver side downmix operation is performed, where the multichannel signal is mixed into two channels. The mixing operation can be described by a downmix matrix, e.g. a 2.5 matrix having two rows and 5 columns in case of downmixing a 5-channel signal into a 2-channel (stereo) signal (the low frequency effect channel is typically not considered during downmix)

Different downmix schemes for mixing the 5 main channels of a 5.1-channel signal into two channels are known, e.g. Lo/Ro (left only, right only) or Lt/Rt (left total, right total).

The downmix step bears the risk of occasional overload of the digital stereo signal, thereby generating undesired clipping artifacts. Such clipping may occur when the amplitude of a downmixed digital signal that would exceed the maximum (or minimum) representable value is limited to the maximum (or minimum) representable value. E.g. in case of a simple unsigned fixed point binary representation, clipping occurs when the computed downmixed amplitude is limited to the maximum value word where all bits correspond to 1. In case of a signed representation in 16 bit, the maximum value may e.g. correspond to the word "01111111 11111111".

As the downmix matrices for the various downmixing schemes are known at the headend, sender or content generation side, for signals that may result in clipping when downmixed, dynamic range control metadata that instructs a receiver to attenuate the signals to-be downmixed prior to mixing can be added to the audio stream to dynamically prevent clipping.

(3) Prevent clipping in case of boosted output: For retransmission over dynamically very limited channels (e.g. from a set-top-box via an analog RF link to the RF input of a TV), the signal is boosted, typically by 11 dB, to achieve a better signal-to-noise-ratio on this path. In such applications, for signals that may result in clipping when amplified by 11 dB, dynamic range control metadata that instructs a receiver to attenuate signals prior to applying the 11 dB amplification can be added to the audio stream to dynamically prevent clipping.

From the perspective of the device receiving the audio stream, it is not clear if the incoming dynamic range control metadata serves the purpose under point (1), i.e. control of the dynamic range, the purpose under point (2), i.e. downmix clipping protection, or the purposes under both points (1) and (2). Often, the metadata accomplishes both tasks, but this is not always the case, so in some cases the metadata may not include downmix clipping protection. In addition, in case the metadata (typically, a different gain parameter is used for RF mode) is associated with the RF mode under point (3), the metadata may be used to prevent clipping in case of an extra amplification (both in case of downmixing and in case of not downmixing).

Moreover, the incoming audio stream may not include dynamic range control metadata at all, due to the fact that for some audio encoding formats the metadata is optional.

If the dynamic range control metadata is not included with the compressed audio stream or is included but does not include downmix clipping protection, undesirable clipping artifacts may be present in the decoded signal if a multichannel signal is downmixed into to fewer channels.

SUMMARY OF THE INVENTION

The present invention describes a method and an apparatus to prevent clipping of an audio signal when clipping protection by audio metadata is not guaranteed.

A first aspect of the application relates to a method of providing protection against signal clipping of an audio signal, e.g. a downmixed digital audio signal, which is derived from digital audio data. According to the method, it is determined whether first gain values based on received audio metadata are sufficient for protection against clipping of the audio signal. The audio metadata is embedded in a first audio stream. E.g. it is determined whether or not the time-varying gain envelope metadata included with a compressed audio stream is sufficient to prevent downmix clipping. In case a first gain value is not sufficient for protection, the respective first gain value is replaced with a gain value sufficient for protection against clipping of the audio signal. Preferably, in case no metadata related to dynamic range control is present in the first audio stream, the method may add gain values sufficient for protection against signal clipping. E.g. in the case where the time-varying gain envelope metadata does not provide sufficient downmix clip protection, or is not present at all, the time-varying gain envelope metadata is modified or added, so that it does provide sufficient downmix clip protection.

The method allows clipping protection, in particular clipping protection in case of downmix, irrespective whether gain values sufficient for clipping protection are received or not.

According to the method, received audio gain words (if provided) may be applied as truthfully as possible but may be overridden when the incoming gain words do not provide enough attenuation to prevent clipping, e.g. in a downmix.

As dynamic range control data serving the purpose under point (1) bears artistic aspects, it is typically not in the duty of the receiving device (e.g. a set-top-box) to introduce this in case the incoming metadata does not provide it. Properties as of (2) though can and therefore should be provided by the receiving instance. This means that the receiving device shall try to preserve dynamic range control data intended for dynamic range control under point (1) as much as possible while at the same time adding clipping protection.

There are various ways to determine whether first gain values based on received audio metadata are sufficient for protection against signal clipping.

According to a preferred approach, second gain values are computed based on the digital audio data, where the second gain values are sufficient for clipping protection of the audio signal. The second gain values may be the maximum allowable gain values which do not result in clipping.

Preferably, the method determines whether the first gain values are sufficient in such a way that it compares the first gain values based on the received audio metadata and the computed second gain values. The method may compare one first value associated with a segment of the audio data with the respective second gain value associated with the same segment of audio data.

In dependency thereon, a clipping protection compliant stream of gain values may be generated from the first and second gain values. Preferably, such gain values are selected from the first gain values and the computed second gain values in dependency on the comparison operations. By selecting a second computed gain value instead of the first gain value, the first gain value is replaced with the selected second gain value.

Preferably, the minimum of a pair of first and second gain values is selected. If the first gain value is larger than the computed second gain value sufficient for protection, this indicates that there is a risk that the first gain value is not sufficient for clipping protection and thus should be replaced with the respective second gain value. Otherwise, if the first gain value is smaller than the computed second gain value sufficient for protection, this indicates that there is no risk of signal clipping and the first gain value should be preserved.

The selection of gain values from the first and second gain values may be carried out as explained below:

In case both the first gain value and the second gain value provide a gain smaller or equal to 1, the minimum of both is taken. This means that either the first gain value already guarantees clipping protection, or if not, it will be replaced by the second gain value. In case the gain of the second gain value is larger than 1 and the first gain value provides a gain smaller or equal to 1, the signal could be amplified and still would not clip. Nevertheless, the incoming audio stream requests attenuation, e.g. to fulfill dynamic range limiting purposes, and thus it is preserved.

In case the first gain value provides a gain larger than 1 and the second gain value provides a gain smaller or equal to 1, the incoming first gain value would violate clipping protection, and so the second gain value is taken.

In case both the first gain value and the second gain value provide a gain larger than 1, the input shall be amplified. This amplification is permitted as long as still no clipping happens, and thus the smaller of the first gain value and the second gain value is used.

An alternative approach for determining whether the first gain values are sufficient for protection is to apply the first gain values to audio data and to determine whether the resulting digital audio signal (e.g. the downmixed signal) clips.

In case the first gain values are not sufficient for protection, one may iteratively determine gain values which are sufficient for clipping protection starting from the first gain values as initial gain values. E.g., one may determine whether the audio signal clips with a gain value which is the closest gain value smaller than the first gain value according to the resolution of the gain values (e.g. in case the first gain value is 0.8 and the gain value resolution is 0.1, the closest smaller gain value would be 0.7). If the signal still clips, one may determine whether the audio signal clips with the next smaller gain value (e.g. a gain value of 0.6). This is repeated until a gain value is found which does not result in signal clipping.

Preferably, the method is performed as part of a transcoding process, where the first audio stream in a first audio coding format (e.g. the AAC format or the High Efficiency AAC (HE-AAC) format, also known as aacPlus) is transcoded into a second audio stream coded in a second audio coding format (e.g. the Dolby Digital format or the Dolby Digital Plus format). The second audio stream comprises the replaced gain values sufficient for clipping or has gain values derived therefrom.

Often audio transcoding is necessary, since the digital compression format for carrying the audio data cannot be kept throughout the whole transmission chain until the final audio decoder in the transmission chain (e.g. until the decoder of the AVR—audio/video receiver). In case of broadcast, this is because, e.g., different coding schemes may be used for the over-the-air broadcast (or broadcast to the consumer via cable) and the transmission of the audio between the receiving device (e.g. a set-top-box—STB) and the final decoder in the transmission chain (e.g. the decoder in the AVR or the audio decoder in the TV set). E.g., the audio data may be broadcast over-the-air via the AAC format or the HE-AAC format, and then the audio data may be transcoded into the Dolby Digital format or the Dolby Digital Plus format for transmission from the STB to the AVR. In consequence, a transcoding step may be performed, e.g. in the STB, to get from one format to the other. Such transcoding step comprises the transcoding of the audio data itself, but ideally also transcoding of the accompanying metadata as well, in particular the dynamic range control data. According to a preferred embodiment, the method provides transcoded audio gain metadata in the second audio stream, with the gain metadata sufficient for protection against signal clipping.

The method may be very useful in any device that transcodes a signal from one compressed audio stream format to another, where it is not known ahead of time whether the time-varying gain control metadata, if any, carried by the first format includes downmix clipping protection (e.g. in an AAC/HE-AAC to Dolby Digital transcoder, a Dolby E to AAC/HE-AAC transcoder, or a Dolby Digital to AAC/HE-AAC transcoder).

Preferably, for determining whether the first gain values are sufficient for protection, the digital audio data is downmixed according to at least one downmixing scheme, e.g. according to a Lt/Rt downmixing scheme. The downmixing results in one or more signals, e.g. in one signal associated with the right channel and one signal associated with the left channel. In addition, a plurality of downmixing schemes may be considered and the digital audio data is downmixed according to more than one downmixing scheme.

Preferably, an actual peak value of various signals derived from the audio signal is continuously determined, i.e. at a given time it is determined which of the various signals has the highest signal value. For computing a peak value, the method may determine the maximum of the absolute values of two or more signals at a given time. The two or more signals may include one or more signals after downmixing according to a first downmixing scheme, e.g. the absolute value of a sample of the downmixed right channel signal and the absolute value of a simultaneous sample of the downmixed left channel signal. In addition, for computing the peak value, the method may also consider the absolute value of one or more signals after downmixing according to a second (and even third) downmixing scheme. Moreover, the peak value determination may consider the absolute value of one or more audio signals before downmixing, e.g. the absolute value of each of the 5 main channels of a 5.1-channel signal at the same time. It should be noted that in case of transcoding it is typically not known whether the multichannel signal is later played back over discrete channels or if downmixing according to a downmixing scheme is performed.

A peak value corresponds to the maximum of these simultaneous signal sample values, thereby indicating the maximum amplitude the signal can have for all possible cases at a particular time instance, and this is the worst case the clipping protection algorithm should take into account.

The dynamic range control data is typically time-varying in a certain granularity that generally relates to the length of the data segment (e.g. block) of the respective audio coding format or integer parts of it. Thus, also a second gain value is preferably computed per data segment.

Therefore, the sampling rate of the peak values or consecutive peak values is preferably reduced (downsampling). This may be done by determining the maximum of a plurality of consecutive peak values or consecutive filtered peak values. In particular, the method may determine the maximum of a plurality of consecutive (filtered) peak values associated with a data segment, e.g. a block or frame. In case of transcoding, the method may determine the highest peak value of a plurality of consecutive (filtered) peak values associated with a data segment of the second (outgoing) data stream. It should be noted that preferably not only the consecutive peak values based on signal samples in an outgoing segment are considered for determining the maximum but also additional (prior and later) peak values which would influence the decoding of the data segment, i.e. peak values which relate to signal samples at the beginning and end of a decoding window. These peak values are also associated with the data segment.

Instead of choosing the highest peak value, one may compute a different value per data segment for reducing the sampling rate.

It should be noted that samples derived from the audio data other than peak values may be downsampled. E.g. the audio data may be downmixed to a single channel (mono) and only the maximum of the downmixed consecutive samples per outgoing data segment is determined According to a different example, first each maximum for each downmixed channel signal is computed per outgoing data segment (downsampling) and then the peak value of these maxima is determined.

Based on the determined maximum, a gain value may be computed by inverting the determined maximum. If 1 is the maximum signal value which can be represented, inverting the determined maximum directly yields a gain factor. When the gain factor is applied to the maximum of the (filtered) peak values, the resulting value equals 1, i.e. the maximum signal value. This means that each audio sample to which the gain is applied is kept below 1 or equals 1, thus avoiding clipping for this data segment. In case 1 is the maximum signal level, 1 corresponds to 0 dBFS—decibels relative to full scale; generally 0 dBFS is assigned to the maximum possible level.

Instead of simply inverting the determined maximum, a gain value may be computed by dividing a maximum signal value (which corresponds to 0 dBFS) by the determined maximum associated with a data segment. However, the computational costs are higher compared to a simple inversion.

In case of transcoding, the data segment (e.g. block or frame) lengths are often different for the first audio coding format (format of input stream) and the second audio coding format (format of output stream). E.g. in AAC a block typically contains 128 samples (in HE-AAC: 256 samples per block), whereas in Dolby Digital a block typically contains 256 samples. Thus, the number of samples per block increases when transcoding from AAC to Dolby Digital. In AAC a frame comprises typically 1024 samples (in HE-AAC: 2048 samples per frame), wherein in Dolby Digital a frame typically comprises 1536 samples (6 blocks). Thus, the number of samples per frame also increases when transcoding from AAC to Dolby Digital. The granularity of the dynamic range control data is mostly either the block size or the frame size. E.g. the granularity of the dynamic range control metadata "DRC" in MPEG for the HE-AAC stream and of the gain metadata "dynrng" in Dolby Digital is the block size. In contrast, the granularity of the gain metadata "compr" in Dolby Digital and of the gain metadata "heavy compression" in DVB (digital video broadcasting) for the HE-AAC stream is the frame size.

In addition, the sampling rates may be different for the input stream (e.g. 32 KHz, or 44.1 KHz) and the output stream (e.g. 48 KHz), i.e. the audio is resampled. This also alters the length relations between the incoming data segments and the outgoing data segments. Moreover, the incoming and outgoing data segments may not be aligned. In addition, it should be noted that metadata transmitted in an input data segment (e.g. block or frame) has an area of dynamic range control impact (i.e. a range in the stream where the application of the gain value has effect) that is often not exactly as large as the data segment but larger. This is due to the overlap-add characteristics of the used transform and to the fact that the dynamic range control is often applied in the spectral domain. The same often holds true for the dynamic range control data of the outgoing audio stream. Therefore, for determining which input gain values influence a given output data segment one may look at the overlap of input and output impact lengths (instead of considering the overlap of the input and the output data segments) as will be explained in detail later on.

Due to the reasons discussed above, transcoding of the dynamic range control data should take into account that an outgoing dynamic range control value may be influenced by more than one incoming dynamic range control value. In this case, a resampling (reframing) of the dynamic range control data may be performed when transcoding the data stream.

Therefore, the method may comprise the step of resampling gain values derived from the received audio metadata of the first audio stream. When a data segment of the first audio stream covers a shorter length of time than a data segment of the second audio stream, the gain values are downsampled.

A resampled gain value may be determined by computing the minimum of a plurality of consecutive gain values. In other words: from a number of input dynamic range control gains (which are relevant for an outgoing data segment), the smallest one is chosen. The motivation for this is to preserve the incoming values as much as possible (in case the values do not result in signal clipping). However, this often is not possible since the gain values have to be resampled. Therefore, the smallest gain value is chosen, which tends to reduce the signal amplitude. However, this reduction of the signal amplitude is regarded as less noticeable or annoying. Preferably, such minimum is determined per output data segment.

In case no gain metadata related to dynamic range control is present in the first audio stream, the method preferably adds gain values sufficient for protection against clipping in the second audio stream (outgoing stream). These gain values should be preferably limited so that they do not exceed a gain of 1. The reason for preventing the gain values from exceeding 1 is that the signal should not be unnecessarily amplified to get close to the clipping border.

Thus, in case a respective computed second gain value has a gain below 1, the respective added gain value corresponds to the computed second gain value. In case a respective computed second gain value is above 1, the respective added gain value is set to a gain of 1.

A second aspect of the application relates to an apparatus for providing protection against signal clipping of an audio signal derived from digital audio data. The apparatus is configured to carry out the method as discussed above. The features of the apparatus correspond to the features of the method as discussed above. Accordingly, the apparatus comprises means for determining whether first gain values based on received audio metadata are sufficient for protection against clipping of the audio signal. Further, the apparatus comprises means for replacing a first gain value with a gain value sufficient for protection against clipping of the audio signal in case the first gain value is not sufficient.

Preferably, the determining means comprise means for computing second gain values based on the digital audio data, where the second gain values are sufficient for clipping protection of the audio signal. More preferably, the determining means also comprise comparing means for comparing the first gain values based on the received audio metadata and the computed second gain values. In dependency thereon, gain values are selected from the first gain values and the computed second gain values.

The above remarks related to the first aspect of the application are also applicable to the second aspect of the application.

A third aspect of the application relates to a transcoder, where the transcoder is configured to transcode an audio stream from a first audio coding format into a second audio coding format. The transcoder comprises the apparatus according to the second aspect of the application. Preferably, the transcoder is part of a receiving device receiving the first audio stream, where the first audio stream is a digital broadcast signal, e.g. an audio stream of a digital television signal (e.g. DVB-T, DVB-S, DVB-C) or a digital radio signal (e.g. a DAB signal). E.g. the receiving device is a set-top-box. The audio stream may be also broadcast via the Internet (e.g. Internet TV or Internet radio). Alternatively, the first audio stream may be read from a digital data storage medium, e.g. a DVD (Digital Versatile Disc) or a Blu-ray disc.

The above remarks related to the first and second aspects of the application are also applicable to the third aspect of the application.

BRIEF DESCRIPTION OF THE DRAWINGS

The invention is explained below in an exemplary manner with reference to the accompanying drawings, wherein.

DETAILED DESCRIPTION

AAC/HE-AAC and Dolby Digital/Dolby Digital Plus support the concept of metadata, more specifically gain words that carry a time varying gain to be optionally applied to the audio data upon decoding. For the purpose of reducing the data, these gain words are typically only sent once per data segment, e.g. per block or frame. In said audio formats these gain words are optional, i.e. it is technically possible to not send the data. Dolby Digital and Dolby Digital Plus encoders typically send the gain words, whereas AAC and HE-AAC encoders often do not send the gain words. However, the numbers of AAC and HE-AAC encoders which send the gain words is increasing. The application allows decoders or transcoders receiving an audio stream to do "the right thing" in both situations. If audio gain words are provided, "the right thing" would be to process the received audio gain words as truthfully as possible, but override them when the incoming gain words do not provide enough attenuation to prevent signal clipping, e.g. in case of a downmix. If no gain values are provided, "the right thing" would be to calculate and provide gain values which prevent signal clipping.

Figure 1:
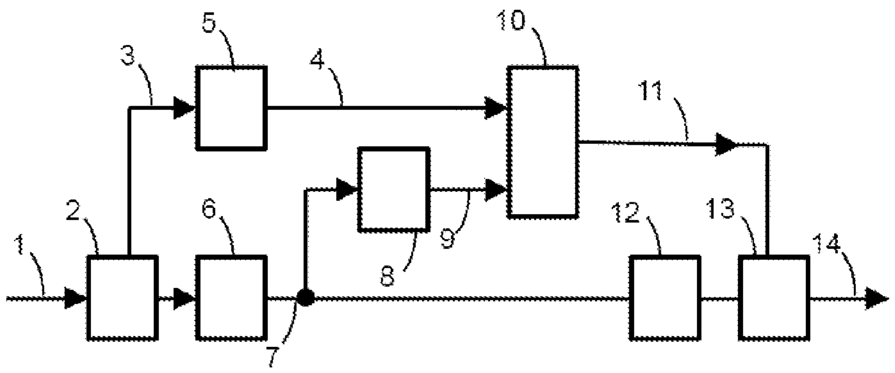
FIG. 1 illustrates an embodiment of a transcoder providing clipping protection.

FIG. 1 shows an embodiment of a transcoder, with the transcoder providing protection against signal clipping, in particular protection against clipping in case of downmixing (e.g. downmixing from a 5.1-channel signal to a 2-channel signal). The transcoder receives a digital audio stream 1 comprising audio metadata. E.g., the digital audio stream is an AAC or HE-AAC (HE-AAC version 1 or HE-AAC version 2) digital audio stream. The digital audio stream may be part of a DVB video/audio stream, e.g. a DVB-T, DVB-S or DVB-C stream. The transcoder transcodes the received audio stream 1 into an output audio stream 14 which is encoded in a different format, e.g. Dolby Digital or Dolby Digital Plus. Typically, Dolby Digital decoders support downmixing of multichannel signals and assume that the time-varying gain envelopes included in received Dolby Digital metadata include downmix clip protection. Unfortunately, bit stream 1 (e.g. an AAC/HE-AAC bitstream) does not necessarily contain time-varying gain envelope metadata, and even in case of carrying such data it is not clear whether the data includes clipping protection. The transcoder prevents a decoder (e.g. a Dolby Digital decoder) in a receiving device (downstream of the transcoder) from producing output signals that contain clipping artifacts when downmixing the signal. The transcoder ensures that output audio stream 14 contains time-varying gain envelope metadata including downmix clipping protection.

In FIG. 1, unit 2 reads out dynamic range control gain values 3 contained in the audio metadata of audio stream 1. Optionally, gain values 3 are further processed in unit 5, e.g. the gain values 3 are resampled and transcoded according to the data segment timing of the transcoded output audio stream 14. The resampling and transcoding of metadata gain values is discussed in the document "Transcoding of dynamic range control coefficients and other metadata into MPEG-4 HE AAC", Wolfgang Schildbach et al., Audio Engineering Society Convention Paper, presented at the 123$^{rd}$ Convention Oct. 5-8, 2007, New York. The disclosure of this paper, in particular the concepts for resampling and transcoding of metadata gain values, is hereby incorporated by reference. In addition, on Sep. 30, 2008 the Applicant filed U.S. provisional application 61/101,497 having the title "Transcoding of Audio Metadata", with the US provisional application relating to resampling and transcoding of metadata gain values. The disclosure of this application, in particular the concepts for resampling and transcoding of metadata gain values, is hereby incorporated by reference.

In parallel to resampling, audio data in audio stream 1 is decoded by a decoder 6, typically to PCM (pulse code modulation) audio data. The decoded audio data 7 comprises a plurality of parallel signal channels, e.g. 6 signal channels in case of a 5.1-channel signal, or 8 signal channels in case of a 7.1-channel signal.

A computing unit 8 determines computed gain values 9 based on audio data 7. The computed gain values 9 are sufficient for protection against signal clipping in a receiving device downstream of the transcoder which receives the transcoded audio stream, in particular when downmixing the signal in the receiving device. Such device may be an AVR or a TV set. The computed gain values should guarantee that the downmixed signal maximally reaches 0 dBFS or less. Gain values 4 derived from the metadata in audio stream 1 and computed gain values 9 are compared to each other in unit 10. Unit 10 outputs gain values 11, where a gain value of gain value stream 4 is replaced by a gain value derived from gain value stream 9 in case the respective gain value of gain value stream 4 is not sufficient to prevent signal clipping in the receiving device. In parallel, audio data 7 is encoded by encoder 12 to an output audio encoding format, e.g. to Dolby Digital or Dolby Digital Plus. The encoded audio data and gain values 11 are combined in unit 13. The resulting audio stream provides audio gain metadata which prevents signal clipping, in particular for the case of signal downmix.

Generally, ingoing audio gain metadata should be preserved as much as possible as long as the gain metadata provides protection against signal clipping. In most cases, the length of a data segment (e.g. block or frame) of the input audio stream (see 1 in FIG. 1) and the length of a data segment (e.g. block or frame) of the output audio stream (see 14 in FIG. 1) are different. Moreover, typically the beginning of a data segment of the input audio stream and the beginning of a data segment of the outgoing audio stream are not aligned (even if the data segment lengths are identical). Thus, a mapping from ingoing metadata to outgoing metadata is typically necessary.

Figure 2:
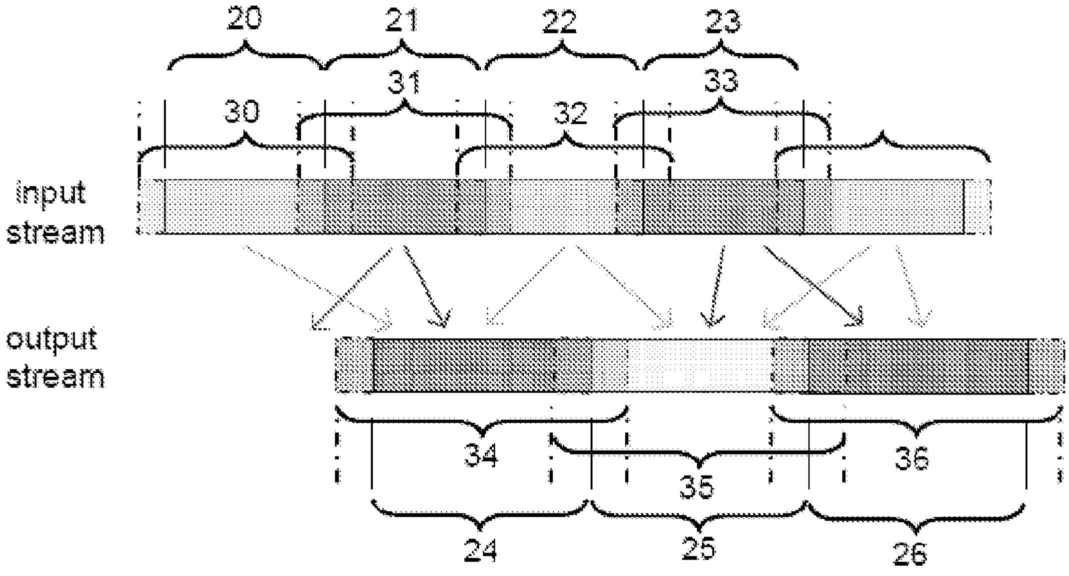
FIG. 2 illustrates a preferred approach for reframing of metadata.

FIG. 2 illustrates a preferred approach for mapping incoming metadata to outgoing metadata. As discussed earlier, typically each data segment (e.g. block or frame) has one gain value of dynamic range control data (or a plurality of gain values, e.g. 8 gain values). However, metadata transmitted alongside an input data segment (e.g. block or frame) has an area of dynamic range control impact (i.e. a range in the stream where the application of the gain value has effect) that is often not exactly as large as the data segment but larger. This is due to the overlap-add characteristics of the used transform (i.e. windows are used which are larger than the data segment and the windows overlap) and to the fact that the dynamic range control is often applied in the spectral domain. The same often holds true for the dynamic range control data of the outgoing audio bit stream. In FIG. 2 the solid lines mark the beginning and the end of a data segment 20-23 in the input stream, and the beginning and end of a data segment 24-26 in the output stream. In FIG. 2 each area of dynamic range control impact 30-33 and 34-36 of a gain value extends beyond the end and the beginning of the respective data segment. Each area of impact 30-33 and 34-36 is indicated by the dashed-dotted lines.

E.g. in HE-AAC, the block size is 256 samples, whereas a window for decoding has 512 samples. The whole window of 512 samples may be regarded as an area of impact; however, the impact of the gain value at the outer edges of the windows is smaller compared to impact at the middle of the window. Thus, the area of impact may be also regarded as a portion of the window. The area of impact may be a number of samples selected from the block/frame size (here: 256 samples) up to the window size (here: 512 samples). Preferably, the used area of impact is larger than the size of the data segment (block or frame).

For determining which input dynamic range control values influence a given output data segment, it is preferred to look at the overlap of input and output impact areas (instead of looking at the overlap of the input and the output data segments). In FIG. 2, it is determined which areas of impact 30-33 in the input stream overlap with an area of impact 34-36 of a given output data segment 24-26. E.g., the area of impact 34 of data segment 24 in the output stream overlaps with the areas 30, 31, 32 and 33. Therefore, preferably, gain values associated with four data segments 20, 21, 22 and 23 are considered when determining the gain value of the first data segment 24 in the illustrated output stream. The first data segment 24 is influenced by the 4 input data segments 20-23. Alternatively, the method may look at the overlap of the input impact areas and the output signal segment, or at the overlap of the input data segments and the output data segment.

Such mapping or resampling process may be carried out in unit 5 of FIG. 1, which receives gain values 3 of the input steam 1 and maps one or more of the gain values 3 to a gain value 4.

Figure 3:
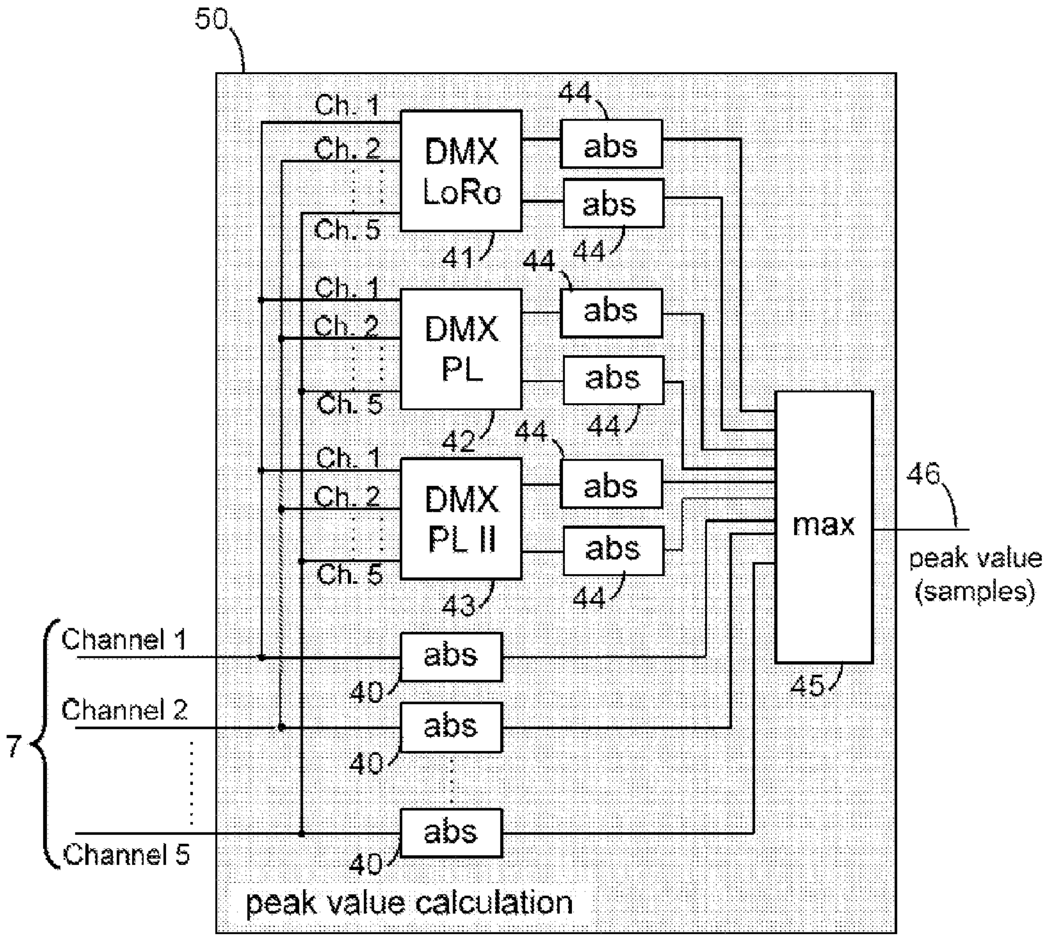
FIG. 3 illustrates an embodiment for determining peak values based on received audio data.

FIG. 3 illustrates an embodiment of block 50 for determining peak values based on received audio data. Such peak determining block 50 may be part of block 8 in FIG. 1. Based on the decoded multichannel audio data 7 comprising a plurality of channels (here 5 channels of a 5.1-channel signal, the low frequency effect channel is not considered), downmixing is performed according to one or more downmix schemes (i.e. according to one or more downmixing matrices). It should be noted that the transcoder does not know whether downmixing is performed in the receiving device at all and which downmixing scheme is then used in the receiving device. Thus, it is unknown if a multichannel signal is played back over discrete channels or if downmixing according to one of several schemes is performed. The transcoder simulates all cases and determines the worst case.

In the example in FIG. 3, downmixing according to the Lo/Ro downmixing scheme is performed in block 41, downmixing according to the Pro Logic (PL) downmixing scheme is performed in block 42, and downmixing according to the Pro Logic II (PL II) downmixing scheme is performed in block 43. The PL downmixing scheme and the PL II downmixing scheme are two variants of the Lt/Rt downmixing scheme as discussed before. Each downmixing scheme outputs a right channel signal and a left channel signal. Then, the absolute values of the signals after downmixing are computed (see blocks 44 in FIG. 3). Preferably, also the absolute sample values of the various channels of the multichannel audio signal 7 are computed (see blocks 40 for determining the absolute values). Considering also the absolute values of the channels (without downmixing) is helpful to prevent signal clipping in other cases than downmixing, e.g. in case the signal is later amplified by an extra gain (e.g. 11 dB gain in case of the RF mode as discussed later on).

The maximum (=peak value) of the absolute values at a time is computed in block 45. Computing the maximum is continuously performed, thereby generating a stream of peak values 46. It may be possible that the various samples have different signal delay due to different signal processing. Such different signal delays may be aligned (not shown). The maximum of the sample values indicates the maximum amplitude a signal can have for all cases, and so this is the worst case the clipping protection algorithm takes into account. The transcoder thus simulates the worst-case amplitude of the signal in the receiving device at a time. A dynamic range control value that achieves protection against clipping should attenuate (or amplify) the signal in a fashion that it reaches 0 dBFS maximally.

It should be noted that block 50 may determine a peak value based on fewer absolute values than illustrated in FIG. 3 (e.g. without considering the absolute values of the non-downmixed channels) or based on additional absolute values not shown in FIG. 3 (e.g. absolute values of other downmixing schemes). Alternatively, it is possible to downmix the channels 7 without determining a peak value: E.g., the two resulting channels may be combined and the combined signal is processed further (instead of using peak values 46 as outputted by block 45).

Figure 4:
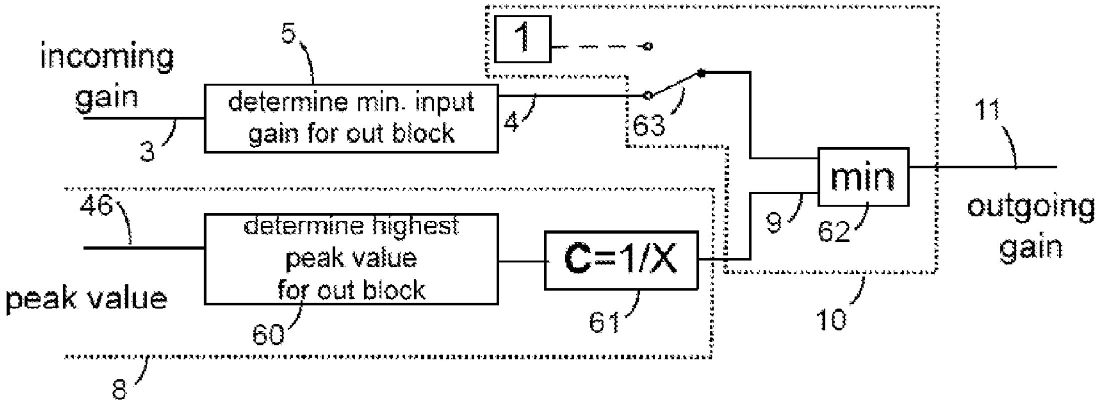
FIG. 4 illustrates an embodiment for merging incoming dynamic range control data with computed gain values sufficient for clipping protection.

The further processing of peak values 46 is indicated in FIG. 4. Figurative elements in FIGS. 1 and 4 denoted by the same reference signs are basically the same. Peak values 46 undergo a step of blocking and maximum building in unit 60. Here, the highest peak value is determined for a given output data segment (e.g. a block). In other words: the peak values are downsampled by selecting the highest peak value (which is the most critical one) for an output data segment from a plurality of peak values. It should be noted that preferably not only consecutive peak values corresponding to the signal samples in an output segment are considered for determining the maximum. Rather, also additional (prior and later) peak values which would influence a given data segment are considered, i.e. peak values which relate to signal samples at the beginning and end of a decoding window. Preferably, all samples of the window are considered.

The result of this sampling is inverted in block 61 according to the formula C=1/X, where C refers to a computed gain value 9 and X refers to the respective highest peak for the block of the output stream 14. The result C is a factor (gain) that guarantees that each audio sample of the data segment (e.g. block) is below or equal to the maximum signal level 1 (corresponding to 0 dBFS) when the gain is applied to the respective audio sample. This avoids clipping for this data segment. It should be noted that the maximum signal level means the maximum signal level of a signal in the receiver of the transcoded audio stream; thus, at the output of block 60 the amplitude may be higher than 1 (when C<1).

The computed gain C is the maximum allowable gain that prevents clipping; a smaller gain value than the computed gain C may be also used (in this case the resulting signal is even smaller). It should be noted that in case the gain C is below 1, the gain C (or a smaller gain) has to be applied, otherwise the signal would clip at least in the worst-case scenario.

In block 5, the incoming gain values 3 from the metadata undergo a resampling as well. From a number of incoming gains relevant for an output data segment, the smallest gain is chosen and used for further processing. Preferably, the resampling is performed as discussed in connection with FIG. 2: For determining which incoming gain values are relevant for an output data segment, the overlap of the input and output impact areas is considered. If the impact area of an incoming data segment overlaps with the impact area of a given output data segment, the incoming data segment is considered (and thus its gain value) when determining the smallest gain value. Instead, also the two alternative approaches as discussed in connection with FIG. 2 may be used.

The motivation for this is to preserve the incoming values. However, this is not possible since the gain values have to be resampled according to the timing of the output stream. Using the smallest gain value from a plurality of consecutive gain values tends to reduce the signal amplitude which is regarded in tendency as less noticeable or annoying.

In case relevant dynamic range control data is present in the incoming data stream 1, a comparison between this gain (preferably after resampling in block 5) and the computed gain values 9 sufficient for clipping protection is done in block 10. Block 62 determines the minimum between a resampled gain value 4 and a computed gain value 9, with the smaller gain value being used as the outgoing gain value (block 62 forms a minimum selector).

In case no incoming gain values are present, switch 63 in FIG. 4 will switch to the upper position, with block 62 then determining the minimum between a gain of 1 and the computed gain value, with the smaller gain value being used as the outgoing gain value. Thus, in case no incoming gain value is present, the outgoing gain value is limited to a maximum gain of 1.

The following table illustrates the operation of comparison block 10. Here, the term "I" denotes the incoming dynamic range control gain 4 (after resampling), and the term "C" denotes the computed gain 9.

| | I ≤ 1 | I > 1 | I not present |
|---|---|---|---|
| C ≤ 1 | min(I, C) | min(I, C) = C | C |
| C > 1 | min(I, C) = I | min(I, C) | 1 |

In case both I and C are smaller or equal to 1, the minimum is taken. This means that either I already guarantees clip protection, or if not, it will be replaced by C.

In case C>1 and I≤1, the signal could be amplified and still would not clip. The incoming stream though requests attenuation, e.g. to fulfill dynamic range limiting purposes, and thus I is preserved (I is the minimum of I and C in this case).

In case I>1 and C≤1, the incoming value would violate clipping protection, and so C is taken (C is the minimum of I and C in this case).

In case both I and C are larger than 1, the input shall be amplified. This amplification is permitted as long as still no clipping happens, and thus the smaller of I and C is used.

In case no incoming dynamic range value is present, clipping protection is ensured by using C as long as C≤1. In case C>1, the signal shall not be modified (i.e. the signal should not be unnecessarily amplified to get close to the clipping border). So unity is taken as the outgoing gain. In both cases when no incoming gain values are present, the minimum of 1 and C is used (instead of the minimum between I and C).

Figure 5:
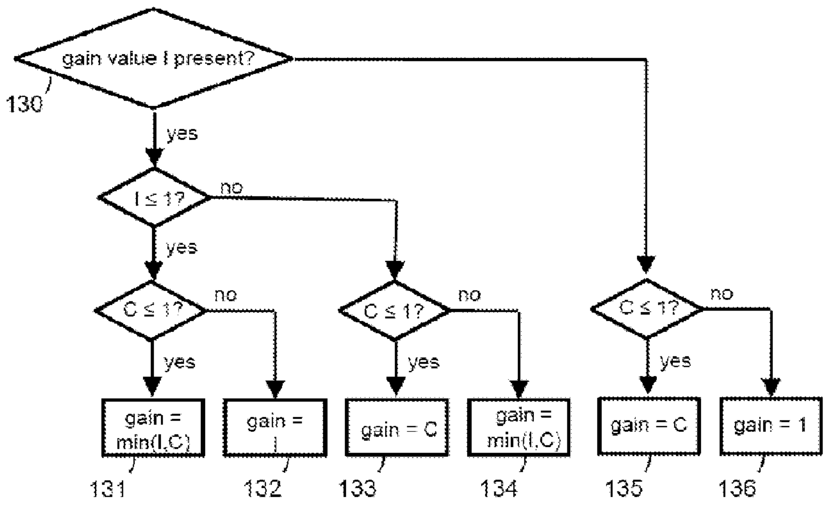
FIG. 5 illustrates the selection of the outgoing gain values.

FIG. 5 illustrates the selection of the outgoing gain values 11 in form of a flowchart. It is determined whether a gain value I is present (see reference 130 in FIG. 5). If a gain value I is currently present, the outgoing gain value depends on the values of the incoming gain value I and the computed gain value C. If I≤1 and C≤1, the selected gain value corresponds to the minimum of I and C (see reference 131). If I≤1 and C>1, the selected gain value corresponds to I (see reference 132). If I>1 and C≤1, the selected gain value corresponds to C (see reference 133). If I>1 and C>1, the selected gain value corresponds to the minimum of I and C (see reference 134). It should be noted that in all these four cases, the outgoing value still corresponds to the minimum of I and C. Thus, it is not necessary to determine whether I and C are ≤1 or not.

If no gain value I is currently present, the outgoing gain value depends on the value of the computed gain value C. If C≤1, the outgoing gain value corresponds to C (see reference 135). If C>1, the outgoing gain value corresponds to 1 (see reference 136). It should be noted that in both cases, the outgoing value still corresponds to the minimum of 1 and C. Thus, it is not necessary to determine whether C is ≤1 or not.

The embodiment as discussed above achieves that incoming dynamics are preserved and only in case clipping would occur, the dynamics are modified to prevent clipping. In case no dynamic range control values are present, sufficient dynamic range control values are added to the stream to prevent clipping. The switching between the modes works instantaneously and smoothly, thereby mitigating any artifacts.

Figure 6:
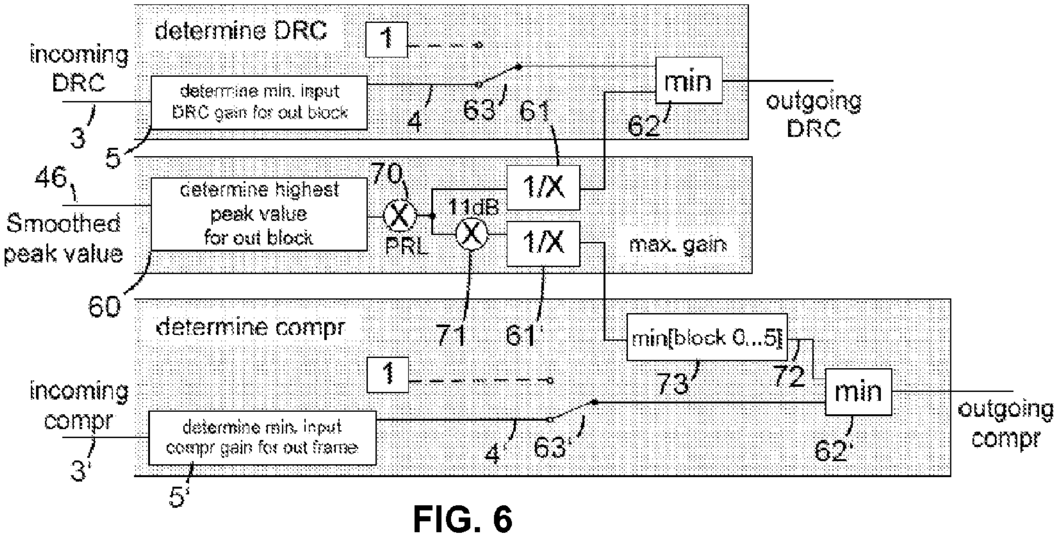
FIG. 6 illustrates an alternative embodiment for merging incoming dynamic range control data with computed gain values sufficient for clipping protection.

FIG. 6 illustrates an alternative to the embodiment in FIG. 4. Figurative elements in FIGS. 4 and 6 denoted by the same reference signs are basically the same. In FIG. 6, separate gain metadata for two different modes, the line mode and the RF mode, are received and transcoded. In the embodiment in FIG. 6 different gain words for the RF mode and the line mode are computed because they use two different types of metadata. The line mode metadata covers a smaller range of values and is sent more often (typically once per block), whereas the RF mode metadata covers a larger range of values and is sent less often (typically once per frame). In the RF mode the signal is boosted by an extra gain of 11 dB, which allows a higher signal-to-noise ratio when transmitting the signal over a dynamically very limited channel (e.g. from a set-top-box to the RF input of a TV via an analog RF antenna link). Moreover, since the RF mode gain metadata covers a wider range of values than the gain metadata of the line mode, the RF mode allows higher dynamic range compression. The gain metadata for the line mode is denoted as "DRC" (see reference sign 3), whereas the gain metadata for the RF mode is denoted as "compr" (see reference sign 3'). Please note that in DVB the gain metadata for the RF mode is denoted as "compression" or "heavy compression". Moreover, the embodiment in FIG. 6 also considers a program reference level (PRL), which may be transmitted as part of the metadata. The PRL indicates a reference loudness of the audio content (e.g. in HE-AAC, the PRL can vary between 0 dB and −31.75 dB). Application of the PRL lowers the loudness of the audio to a defined target reference level. In dependency of the audio encoding format other terms for the reference are common, e.g. dialogue level, dialogue normalization or dialnorm.

In FIG. 6 the highest peak value for a data block (as generated by unit 60) is level adjusted in unit 70 in dependency on the received PRL (normally, the level is reduced by the PRL). For computing gain values associated with the line mode, the level adjusted samples are inverted in block 61, thereby generating computed gain values which guarantee that each audio sample of the block is below or equal to the maximum signal level 1 in case the audio signal is adjusted in the receiver by the PRL. The resampling of the incoming DRC data 3 in block 5, and the comparison of the resampled gain values 4 and the computed gain values are identical to FIG. 4.

For computing gain values associated with the RF mode, the level adjusted samples are amplified by 11 dB in block 71 since in the receiver the signal is also amplified by 11 dB in case of using the RF mode. The transcoder thus simulates the worst-case amplitude of the signal in the receiving device. The boosted samples are inverted in block 61', thereby generating computed gain values for the RF mode which guarantee that each audio sample of the block is below or equal to 1 (=maximum signal amplitude) in case the audio signal is adjusted in the receiver by the PRL and boosted by 11 dB.

The embodiment in FIG. 6 is preferably used for a transcoder outputting a Dolby Digital audio stream (e.g. an HE-AAC to Dolby Digital transcoder or an AAC to Dolby Digital transcoder). According to Dolby Digital, in the line mode each coding block has a "DRC" (dynamic range control) gain value, whereas in the RF mode each frame (which comprises 6 blocks) has a "compr" gain value. Nevertheless, both types of gain values relate to dynamic range control. The computed gain value for the RF mode is downsampled from the block rate to the frame rate in block 73. Block 73 determines the minimum of the computed gain values for a total number of 6 consecutive blocks, with each minimum assigned to the computed gain value 72 for the whole frame. The resampling of the incoming compr gain values 3' in block 5' differs from the resampling in block 5 in such a way that the minimum for an output frame is determined. The comparison of the resampled gain values 4' and the computed frame-based gain values 72 is the same as discussed before.

The embodiment in FIG. 6 provides protection not only against clipping in case of downmixing, but also against signal clipping when applying an extra gain of 11 dB in the RF mode (otherwise the 11 dB boosted signal may clip even when not using signal downmixing). Therefore, it is advantageous to consider in block 50 also the absolute values of the channels without downmix.

It should be noted that in case no PRL is received, preferably, the PRL is set to a default value.

Figure 7:
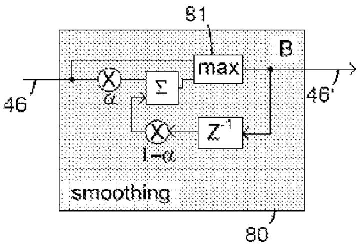
FIG. 7 illustrates an embodiment of a smoothing filter stage.

For computing gain values, a smoothing stage may be used. FIG. 7 shows an embodiment of a smoothing stage 80 which may be placed anywhere in the path between the output of block 50 and the input of blocks 61 and 61'. Preferably, smoothing stage 80 is placed at the output of block 50, thereby generating smoothed peak values 46' based on the peak values 46. Smoothing stage 80 implements a low pass filter for the input signal of the smoothing stage, e.g. the peak value signal. Its purpose is to improve the audible impression after the clipping protection kicks in: an immediate release of a ducking gain after a period of clipping protection will sound annoying. Thus, as is widely done in limiter implementations, the peak value signal (and by that the derived gain signal; see below) is filtered with a $1^{st}$ order low-pass filter, which preferably operates at a time constant τ of 200 msec. In case a new input value demands clipping protection to a higher degree than the smoothed signal would achieve (since the new input value is higher than the smoothed signal), it bypasses the smoothing stage and gets into effect immediately. In this case the upper input is larger than the lower input of the maximum computing block 81 in FIG. 7.

Preferably, the embodiment in FIGS. 3-7 are part of an audio transcoder, e.g. from AAC and/or HE-AAC to Dolby Digital, or from Dolby E or Dolby Digital to AAC and/or HE-AAC. However, it should be noted that the embodiments in FIGS. 3-7 are not necessarily part of an audio transcoder. These embodiments may be part of the device receiving the incoming audio stream 1 and applying the modified gain values (without transcoding). The modified gain values may be directly used for adjusting the gain of the received audio stream. E.g., the embodiments in FIGS. 3-7 may be part of an AVR or a TV set.

Figure 8:
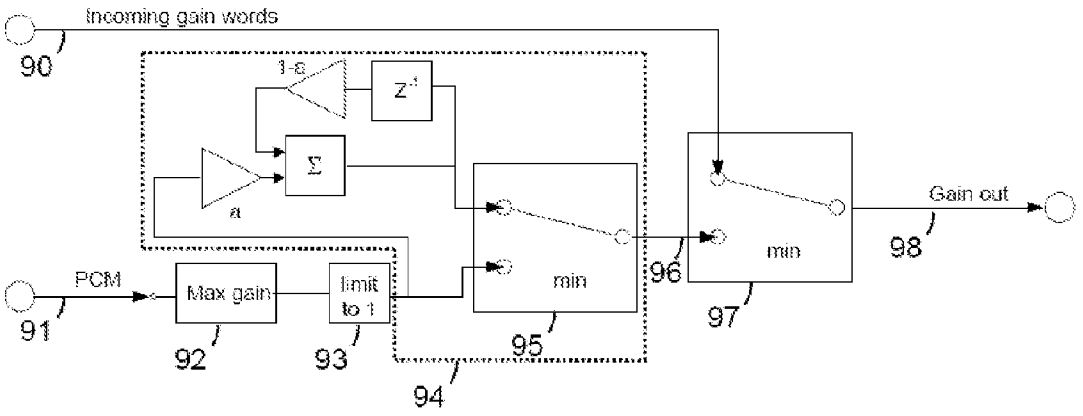
FIG. 8 illustrates another embodiment for providing clipping protection.

FIG. 8 illustrates an alternative embodiment for providing downmix protection. The apparatus receives incoming gain words 90 contained in or derived from audio metadata. to Gain words 90 may correspond to the gain values 3 or 4 in FIGS. 1 and 4. Further, the apparatus receives audio samples 91 (e.g. PCM audio samples). E.g., the audio samples 91 may be peak values as generated by block 50 in FIG. 3. If the audio samples 91 are not absolute values, the absolute value of the audio samples 91 may be determined before. In block 92 maximum allowed gain values $gain_{max}(t)$ are computed by a division according to the following equation:

$$gain_{max}(t) = \frac{signal_{max,allowed}}{\text{signal}(t)}$$

Here, the term $signal_{max,allowed}$ denotes the maximum allowed signal amplitude, e.g. $signal_{max,allowed}=1$. The term signal(t) denotes the current audio sample 91.

In block 93, the maximum allowed gain values $gain_{max}(t)$ are limited to a maximum gain of 1: If a value $gain_{max}(t)$ is above 1, then $gain_{max}(t)$ will be set to 1. However, if a value $gain_{max}(t)$ is below 1 or equals 1, the value will be not modified.

The output of block 93 is fed to a smoothing filter stage 94. Smoothing filter stage 94 contains a low pass filter and a minimum selector 95 which selects the minimum of its two inputs. The operation is similar to the smoothing filter stage 80 in FIG. 7. However, here a minimum selector 95 instead of a maximum selector 81 is used since the filter stage 94 smoothes gain values instead of audio samples (the gain values are derived by inverting audio samples). A smoothing filter stage 80 may be used instead when being placed upstream of block 92 (which determines gain values by inversion). Analogously, smoothing filter stage 94 may be used in FIGS. 4 and 5 when being placed downstream of blocks 61 and/or 61' (since downsteam of blocks 61 and/or 61' gain signals are processed). Smoothing filter stage 94 smoothes the signal slope in case of an abrupt increase of the gain value at block 93 (otherwise the audio may sound annoying). In contrast, smoothing filter stage 94 lets the gain signal pass without smoothing in case of an abrupt decrease of the gain value (otherwise the signal would clip). The computed gain signal 96 at the output of smoothing filter stage 95 is compared with the incoming gain words 90 in minimum selector 97. The minimum of the actual computed gain value 96 and the actual incoming gain word 90 is passed to the output of minimum selector 97. The gain values 98 at the output of minimum selector 97 provide downmix protection and may be embedded in a transcoded audio stream as discussed before.

It should be noted that the embodiment in FIG. 8 is not necessarily part of an audio transcoder. The output gain values may be directly used for adjusting the level of the received audio stream. In this case the apparatus of FIG. 8 may be part of an AVR or TV set.

Moreover, the embodiment in FIG. 8 may be used to prevent signal clipping without considering downmixing. E.g. the embodiment in FIG. 8 may receive conventional PCM audio samples 91 without further pre-processing in block 50. In this case the embodiment in FIG. 8 prevents clipping when PCM samples 91 are amplified by the output gain values.

Figure 9:
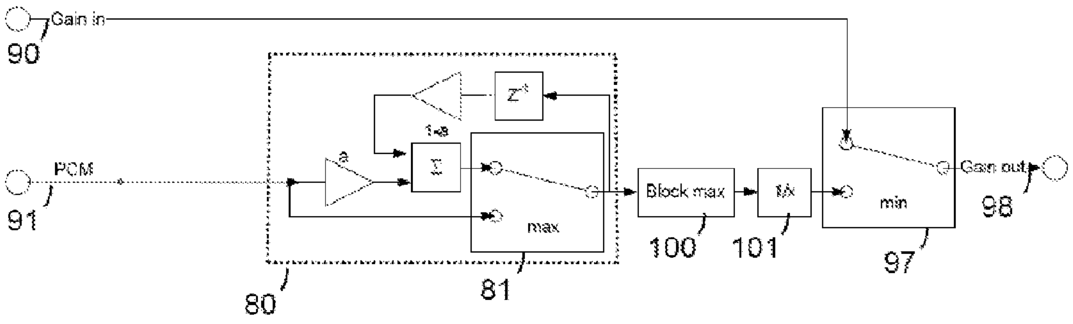
FIG. 9 illustrates still another embodiment for providing clipping protection.

FIG. 9 illustrates another alternative embodiment. Figurative elements in FIGS. 8 and 9 denoted by the same reference signs are basically the same. In contrast to the embodiment in FIG. 8, the embodiment in FIG. 9 is a block-wise operating version like the embodiments in FIGS. 4 and 6, where only one division is performed per signal block (or any other data segment like frame). This reduces the number of divisions per time. As discussed already in connection with FIG. 8, audio samples 91 may be generated by block 50 of FIG. 3. If the audio samples 91 are not absolute values, the absolute values of the audio samples 91 may be determined before (not shown in FIG. 9). The audio samples 91 are then fed to a smoothing filter stage 80 which corresponds to smoothing filter stage 80 in FIG. 7. In contrast to FIG. 8, smoothing filter stage 80 processes audio samples instead of gain samples. Thus, smoothing filter stage 80 uses a maximum selector 81 instead of a minimum selector 95. After smoothing, the maximum of the samples per audio block is determined in unit 100. Then, the maximum value is inverted in block 101, thereby computing the maximum allowable gain per block. This gain value is compared to the current gain value 90 in minimum selector 97, with the minimum of both values being passed to the output of minimum selector 97. The gain values 98 at the output of minimum selector 97 provide downmix clipping protection and may be embedded in a transcoded audio stream as discussed before. The embodiment in FIG. 9 may be modified to generate a gain value 98 in a similar way when no incoming gain value 90 is present: If no incoming gain value 90 is present and the computed gain is smaller or equal to 1, the computed gain value is outputted. In case the computed gain value is larger than 1 (and no incoming gain value 90 is present), a gain value having a gain of 1 is outputted. This may be realized by the additional switch 63 of FIG. 6, with the switch switching between the incoming gain value 90 and a gain of 1 in dependency of the presence of the incoming gain value 90.

It should be noted that the embodiments as discussed before correspond to a limiter that respects gain values coming from a different compressor instance.

Figure 10:
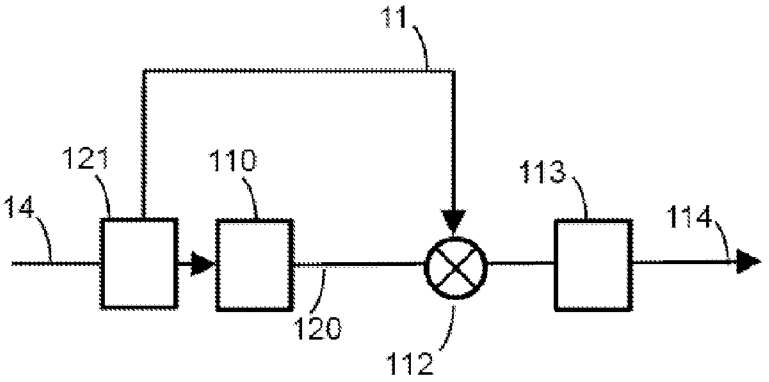
FIG. 10 illustrates a receiving device receiving the transcoded audio stream.

FIG. 10 illustrates a receiving device receiving the transcoded audio stream 14 as generated by the transcoder of FIG. 1. Block 121 separates the gain values 11 from the audio stream 14. The receiving device further comprises a decoder 110 which generates a decoded audio signal 120. The amplitude of the decoded audio signal 120 is adjusted in block 112 by the gain values 11 as derived in FIG. 1. In case an optional downmix is performed in block 113, the output signal 114 does not clip since the gain values 11 are sufficient to prevent signal clipping in case of a downmix. The amplitude of the decoded audio signal 120 may be further adjusted by the PRL (not shown). In case the gain values 11 also consider an 11 dB boost in the RF mode as discussed in connection with FIG. 6, the audio signal 120 may be also boosted by 11 dB without clipping (both in case of a signal downmix and in case of no signal downmix).

The invention claimed is:

1. A method of providing protection against signal clipping of an audio signal derived from digital audio data, the method comprising:

determining whether first gain values based on received audio metadata are sufficient for protection against clipping of the audio signal, the received audio metadata embedded in a first digital audio stream; and in case a first gain value is not sufficient, replacing the respective first gain value with a gain value sufficient for protection against clipping of the audio signal, wherein the step of determining comprises the steps of:

computing second gain values based on the digital audio data, the second gain values sufficient for clipping protection of the audio signal;

comparing the first gain values based on the received audio metadata and the computed second gain values; and selecting a minimum of a first gain value and a corresponding second gain value based on comparing the first gain values and the computed second gain values.

2. The method of claim 1, wherein the step of computing second gain values comprises:

determining maximum allowable gain values.

3. The method of claim 1, wherein the method is performed in the course of transcoding the first audio stream coded in a first audio coding format into a second audio stream coded in a second audio coding format different from the first audio coding format, the second audio stream comprising audio metadata having the replaced gain values sufficient for protection against clipping of the audio signal or having gain values derived therefrom.

4. The method of claim 1, wherein the audio signal is a downmixed audio signal and the method provides protection against signal clipping of the downmixed signal.

5. The method of claim 1, wherein the step of determining whether first gain values are sufficient for protection comprises the step of:

downmixing the digital audio data according to at least a first downmixing scheme.

6. The method of claim 5, wherein the step of determining whether first gain values are sufficient for protection comprises the step of:

computing peak values, wherein a peak value is computed by determining the maximum of the absolute values of at least two audio signals at a time, the at least two audio signals selected from the following group of:

at least two audio signals after downmixing according to the first downmixing scheme, at least two audio signals before downmixing, and at least two audio signals after downmixing according to a second downmixing scheme.

7. The method of claim 1, wherein the step of determining whether first gain values are sufficient for protection comprises the step of:

determining the maximum of a plurality of consecutive signal values derived from the digital audio data.

8. The method of claim 7, wherein the step of determining whether first gain values are sufficient for protection comprises the step of:

computing peak values, wherein a peak value is computed by determining the maximum of the absolute values of at least two audio signals at a time, the at least two audio signals selected from the following group of:

at least two audio signals after downmixing according to a first downmixing scheme, at least two audio signals before downmixing, and at least two audio signals after downmixing according to a second downmixing scheme, and wherein the plurality of consecutive signal values correspond to consecutive peak values or consecutive filtered peak values.

9. The method of claim 7, wherein the method is performed in the course of transcoding the first audio stream coded in a first audio coding format into a second audio stream coded in a second audio coding format different from the first audio coding format, the second audio stream comprising audio metadata having the replaced gain values sufficient for protection against clipping of the audio signal or having gain values derived therefrom, and wherein the second audio stream is organized in data segments, and the maximum of a plurality of signal values associated with a segment of the second audio stream is determined.

10. The method of claim 7, wherein a maximum signal value is divided by the determined maximum.

11. The method of claim 7, wherein the determined maximum is inverted.

12. The method of claim 1, wherein the method is performed in the course of transcoding the first audio stream coded in a first audio coding format into a second audio stream coded in a second audio coding format different from the first audio coding format, the second audio stream comprising audio metadata having the replaced gain values sufficient for protection against clipping of the audio signal or having gain values derived therefrom, and wherein the first audio stream is organized in data segments, at least one gain value being received per data segment of the first audio stream, the second audio stream is organized in data segments, and the method further comprises the step of:

resampling gain values of the first audio stream.

13. The method of claim 1, comprising the step of:

wherein the method is performed in the course of transcoding the first audio stream coded in a first audio coding format into a second audio stream coded in a second audio coding format different from the first audio coding format, the second audio stream comprising audio metadata having the replaced gain values sufficient for protection against clipping of the audio signal or having gain values derived therefrom, and wherein the first audio stream is organized in data segments, at least one gain value being received per data segment of the first audio stream, the second audio stream is organized in data segments, the method further comprises the step of:

determining the minimum of a plurality of consecutive gain values of the first audio stream.

14. An apparatus for providing protection against signal clipping of an audio signal derived from digital audio data, comprising:

determining means for determining whether first gain values based on received audio metadata are sufficient for protection against clipping of the audio signal, the received audio metadata embedded in a first digital audio stream; and replacing means for replacing a first gain value with a gain value sufficient for protection against clipping of the audio signal in case the first gain value is not sufficient for protection, wherein the determining means comprise:

computing means for computing second gain values based on the digital audio data, the second gain values sufficient for clipping protection of the audio signal;

comparing means for comparing the first gain values based on the received audio metadata and the computed second gain values, and for selecting a minimum of a first gain value and a corresponding second gain value, based on comparing the first gain values and the computed second gain values.

15. The apparatus of claim 14, wherein the apparatus is part of a transcoder, the transcoder configured to transcode the first audio stream coded in a first audio coding format into a second audio stream coded in a second audio coding format different from the first audio coding format, the second audio stream comprising audio metadata having the replaced gain values sufficient for protection against clipping of the audio signal or having gain values derived therefrom.

16. The apparatus of claim 14, wherein the audio signal is a downmixed audio signal and the apparatus provides protection against signal clipping of the downmixed signal.

17. A transcoder configured to transcode a first audio stream coded in a first audio coding format into a second audio stream coded in a second audio coding format, the transcoder comprising the apparatus of claim 14.

18. A transcoding apparatus for transcoding a first audio stream coded in a first audio coding format into a second audio stream coded in a second audio coding format, comprising:

determining means for determining whether metadata related to dynamic range control is present in the first audio stream and, if so, whether first gain values based on received audio metadata are sufficient for protection against clipping of the audio signal; and gain value adding means for adding gain values to the second audio stream; wherein the determining means comprises:

computing means for computing second gain values based on the digital audio data, the second gain values sufficient for clipping protection of the audio signal;

comparing means for comparing the first gain values based on the received audio metadata and the computed second gain values if metadata related to dynamic range control is present in the first audio stream, and for selecting a minimum of a first gain value and a corresponding second gain value, based on comparing the first gain values and the computed second gain values; and wherein the gain value adding means comprises:

means for adding the selected gain value to the second audio stream if metadata related to dynamic range control is present in the first audio stream; and means for adding the second gain values to the second audio stream if metadata related to dynamic range control is not present in the first audio stream.

* * * * *